United States Patent
Stengel et al.

(12) 
(10) Patent No.: US 6,650,185 B1
(45) Date of Patent: Nov. 18, 2003

(54) FREQUENCY SELECTIVE DISTRIBUTED AMPLIFIER

(75) Inventors: Robert Stengel, Pompano Beach, FL (US); Scott Olson, Davie, FL (US)

(73) Assignee: Motorola, Inc, Schaumburg, IL (US)

(*) Notice: Subject to any disclaimer, the term of this patent is extended or adjusted under 35 U.S.C. 154(b) by 0 days.

(21) Appl. No.: 10/133,829

(22) Filed: Apr. 26, 2002

(51) Int. Cl.[7] .................................................. H03F 3/60
(52) U.S. Cl. ...................................... 330/286; 330/295
(58) Field of Search ............................... 370/53, 124 R, 370/286, 295, 84; 327/123; 333/117

(56) References Cited

U.S. PATENT DOCUMENTS

| | | | | |
|---|---|---|---|---|
| 6,049,250 A | * | 4/2000 | Kintis et al. | 330/54 |
| 6,377,125 B1 | * | 4/2002 | Pavio et al. | 330/286 |
| 6,400,226 B2 | * | 6/2002 | Sato | 330/286 |

* cited by examiner

*Primary Examiner*—Henry Choe (57) ABSTRACT

A frequency selective differential amplifier (400) consistent with certain embodiments of the invention has a plurality of N amplifier stages (401, 402, 403 through 404) that collectively drive load (410). The plurality of N amplifier stages (401, 402, 403, ..., 404) have input nodes and output nodes. A plurality of N−1 output phase shift circuits (421, 422, ..., 423) connect the output nodes of the plurality of amplifier stages in a manner that causes output signals from the plurality of output nodes to add together for delivery to the load (410), the plurality of output phase shift circuits (421, 422, ..., 423) have a plurality of phase shifts of $\theta(f) = \{\theta(f)_{1,2}; \theta(f)_{2,3}; \ldots ; \theta(f)_{N-2,N-1}\}$. A plurality of N−1 input phase shift circuits (431, 432 through 433) are coupled to the plurality of input nodes and provide input signals thereto. The plurality of input phase shift circuits (431, 432, ..., 433) have a plurality of phase shifts of $\Phi(f) = \{\Phi(f)_{1,2}; \Phi(f)_{2,3}; \ldots ; \Phi(f)_{N-2,N-1}\}$. To achieve the frequency selectivity of the current invention, $\theta(f)$ is not equal to $\Phi(f)$, so that output signals from the plurality of N amplifier stages (401, 402, 403, ..., 404) are added with a frequency dependent phase relationship.

31 Claims, 8 Drawing Sheets

FREQUENCY SELECTIVE DISTRIBUTED AMPLIFIER

FIELD OF THE INVENTION

This invention relates generally to the field of electronic amplifiers. More particularly, in certain embodiments, this invention relates to radio frequency (RF) amplifiers using delay line signal processing.

BACKGROUND OF THE INVENTION

Conventional radio frequency transmitters and receivers are in common use in two-way radio transceivers and wireless and cellular telephones. Commonly, such devices operate at a transmitting frequency that differs somewhat from a receiving frequency. It is the nature of transmitter amplifiers of such devices to amplify both the desired transmitter signal as well as a spectrum of noise about the transmitting frequency. Due to the close physical proximity of the transmitter and receiver in such devices, it is especially important for noise and other signals in a receiving frequency band not to be amplified to introduce noise or blocking in the receiver.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawing.

Figure 1:
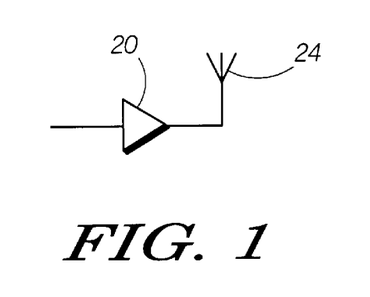
FIG. 1 is a block diagram of an RF amplifier.
Figure 2:
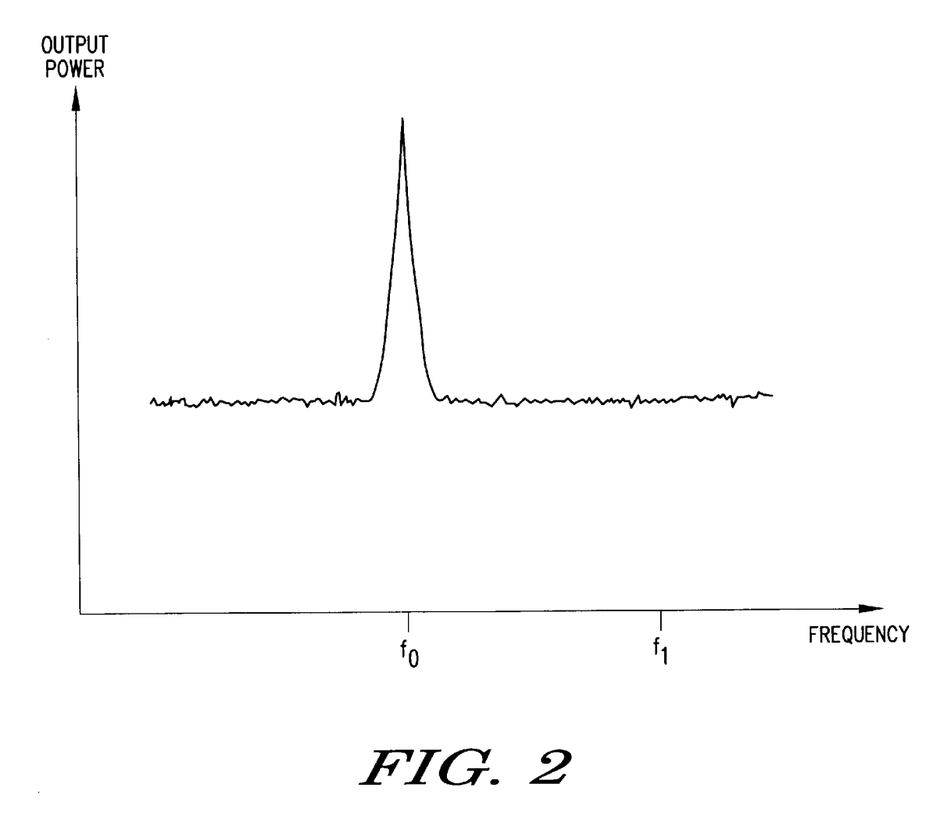
FIG. 2 is a graph depicting an amplified frequency response output of the amplifier of FIG.

With reference to FIG. 1, taken in conjunction with FIG. 2, an RF amplifier 20 is depicted driving a load such as an antenna 24. The RF amplifier, as is known, amplifies a range of frequencies about a desired output frequency $f_0$ (the desired transmitting frequency) including any noise created by or picked up in the transmitter circuit as shown in FIG. 2. Without benefit of any filtering, the amplifier 20 might produce amplified frequency components around an undesired frequency such as $f_1$.

Figure 3:
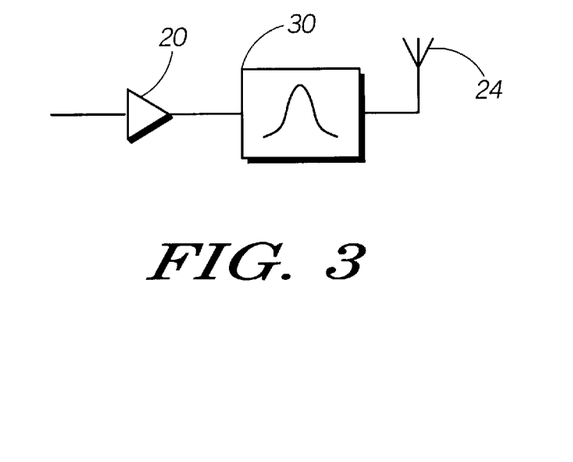
FIG. 3 is a block diagram of an RF amplifier followed by a filter used to reduce out-of-band output from the amplifier.
Figure 4:
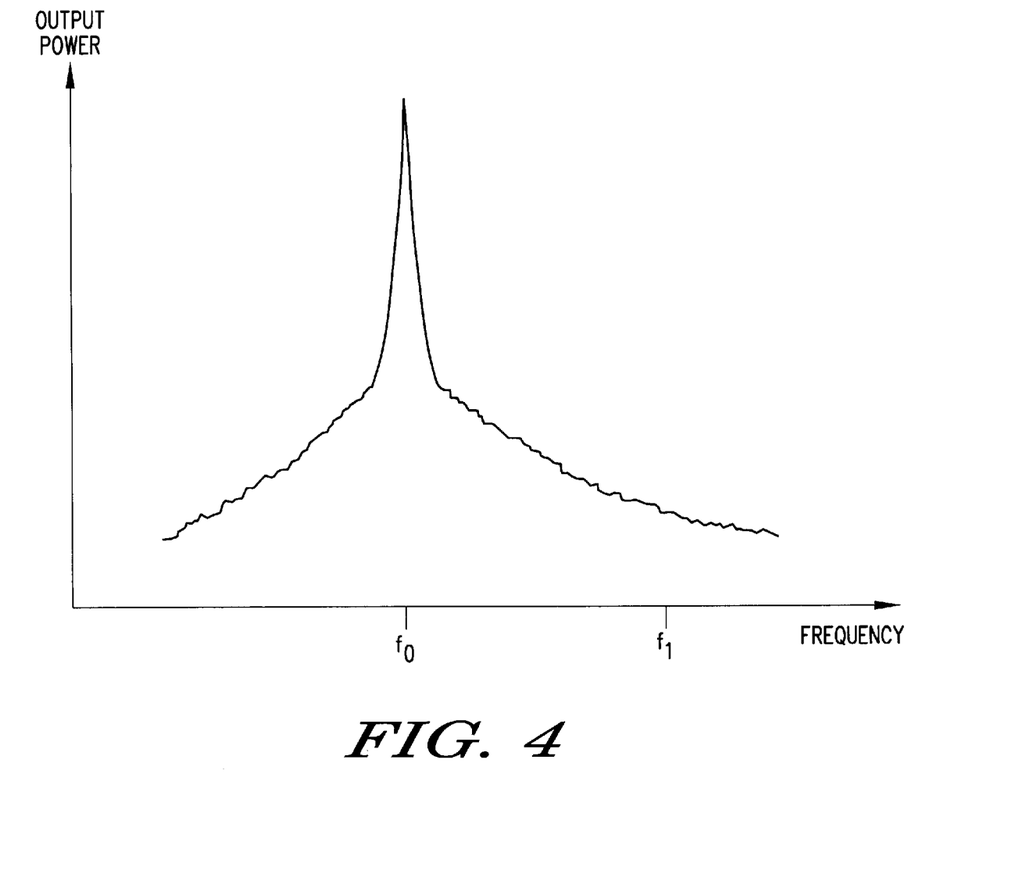
FIG. 4 is a graph depicting an amplified frequency response output of the amplifier and filter of FIG. 3.

In the extreme case where $f_1$ is the frequency of an associated receiver in a transceiver, the results could be unacceptable (and potentially illegal) operation. Conventionally, filtering at the output of the amplifier is used, as depicted in FIG. 3 using filter 30, to suppress out of band noise amplification. By insertion of the filter 30, a transmitted frequency spectrum such as that illustrated in FIG. 4 results wherein the out-of-band transmitted spectrum is reduced to an acceptable level. Unfortunately, the insertion of a highly selective (and possibly tunable) filter 30 into the transmitter stream generally introduces losses that dissipate carrier $f_0$ as heat rather than as being directed to the antenna 24. Additionally, it is very complex to implement such filtering in a wideband application where the filter's passband frequency is adjustable. Moreover, for tunable wideband amplifier applications the constraints on the filter design increases the cost and complexity of filter 30.

Thus, as the demand for wireless communications devices to operate over a very large frequency range increases, there is a need to tune the bandpass filtering of the undesired receiver noise signals from the transmitter signal close to the antenna. There is a similar need for rejection of the high power transmitter signal at the receiver input. The variety of solutions being considered focus around the use of MEMS switches or continuously tuned components. Presently these MEMS components are not compatible with the integrated circuit technology used in wireless communications implementations. It would, therefore, be desirable to have programmable RF frequency response implemented within an integrated circuit technology presently used in wireless communications transceivers. Further, it would be desirable to eliminate or minimize post amplification filtering by incorporating frequency selectivity into the RF amplification.

Figure 5:
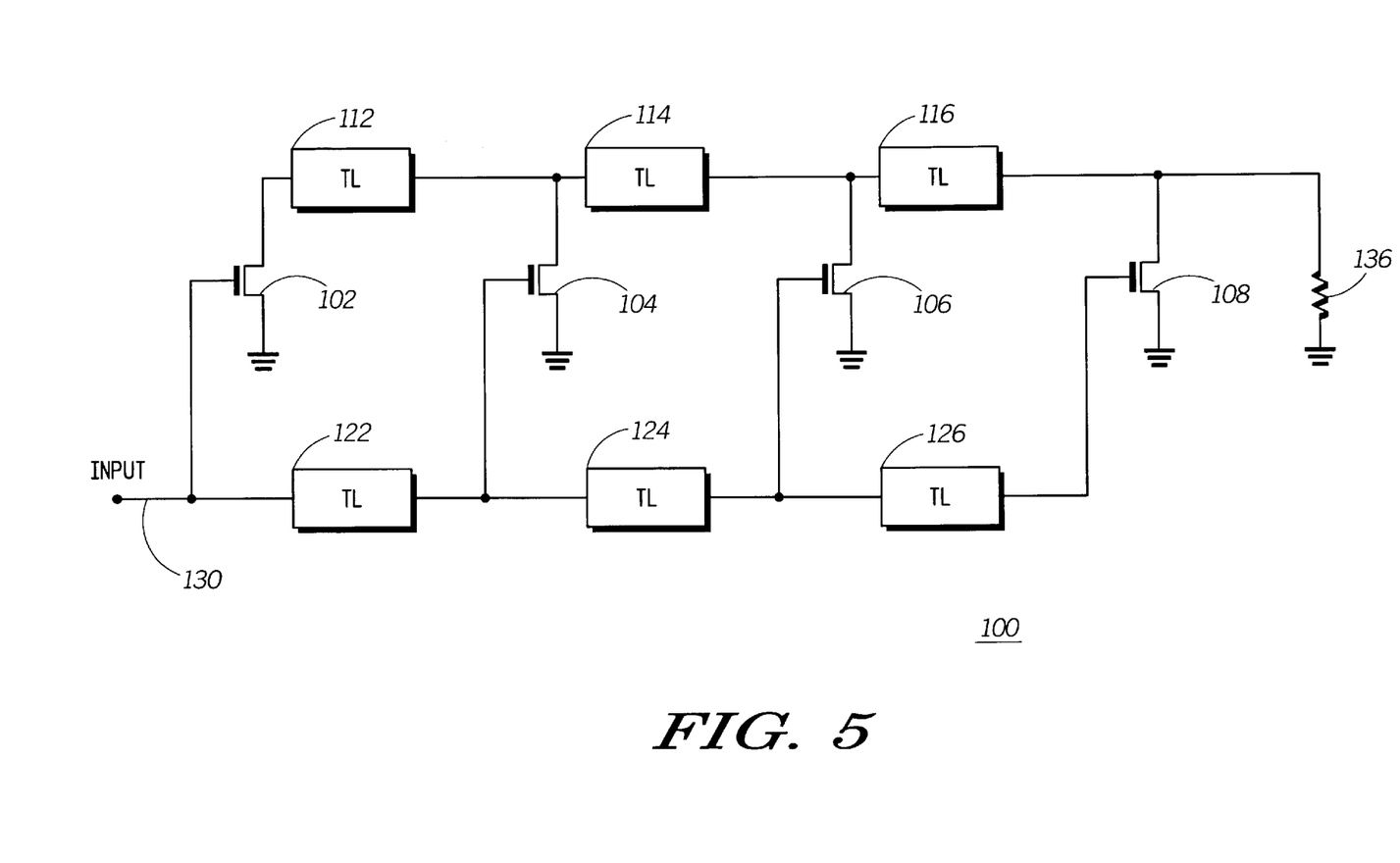
FIG. 5 is a diagram of a four stage distributed amplifier consistent with certain embodiments of the present invention.

Distributed amplifier technology has not been a technology that has been commonly used for RF power amplifier applications in the past. Historically, distributed amplifiers have been used in electronic instrumentation and other applications where wide bandwidth amplification is needed. FIG. 5 depicts an exemplary four-stage differential amplifier circuit that can be adapted for use in conjunction with certain embodiments of the present invention. In this circuit four amplifier stages 102, 104, 106 and 108 are connected together at output nodes thereof (the drains in this exemplary FET implementation), by a set of transmission lines 112, 114 and 116. These transmission lines may be lumped element transmission lines, striplines, coaxial lines or any other element or combination of elements that reacts with the input and output impedances of the amplifier stages to produce a wideband transmission line equivalent. The input nodes of the amplifiers are also connected together using transmission lines 122, 124 and 126.

In a conventional manner of operation of the amplifier 100 of FIG. 5, the amplifier operates in a manner such that the phase shift of transmission line 112 and 122 are equal, as are the phase shifts of transmission lines 114 and 124 and of 116 and 126. In this manner, each stage of amplification of an input signal applied at node 130 produces an amplified version of the amplified signal that is added in phase with the amplified signal at each of the other amplifier stages. Thus, for a four stage conventional distributed amplifier, the output signal driving the load 136 is four times the amplification achieved by each individual stage (assuming equal stages of amplification).

The term "stage" as used herein is a term of convenience in referencing the various amplifiers making up a distributed amplifier. Those having ordinary skill in the art will appreciate, however, that the term should not imply that the "stages" are cascaded to produce a multiplicative effect. Rather, the individual "stages" of the present distributed amplifier contribute to the overall output power delivered to the load in an additive manner. Thus, all things being equal, a four-stage distributed amplifier can deliver power output to a load that is the sum of the contributions of each of the four stages, and those contributions may or may not be equal at maximum power output. In accordance with certain embodiments of the present invention, deviation from this manner of operation is used to create filtering effects within the distributed amplifier. This is achieved by design of the transmission lines 112, 114, 116, 122, 124 and 126 so that the phase alignment of output from each of the amplifier stages at the desired frequency to be amplified is retained, but "not in phase" combination of the amplifier output signals is achieved out-of-band, or at frequencies of particular interest to reduce the level of amplification from amplifier 100. The term "not in phase", and similar terms as used herein, are intended to embrace signals that are not substantially aligned in phase so as to produce the full potential output signal at the load. This term is used to contrast with the term "out of phase" which suggests a 180 degree phase difference in two signals, but it should be noted that the term "not in phase" is inclusive of signals that are "out of phase".

In one embodiment consistent with the present invention, the input transmission lines are replaced with circuits that introduce fixed or variable phase shifts while the output transmission lines are of conventional design to provide a linear phase shift across the frequency band of interest. However, this should not be considered limiting since any arrangement which introduces a difference in the phase shift between the input phase shift circuits and the output phase shift circuits can be used to produce a filtering effect within the amplifier 100.

Figure 6:
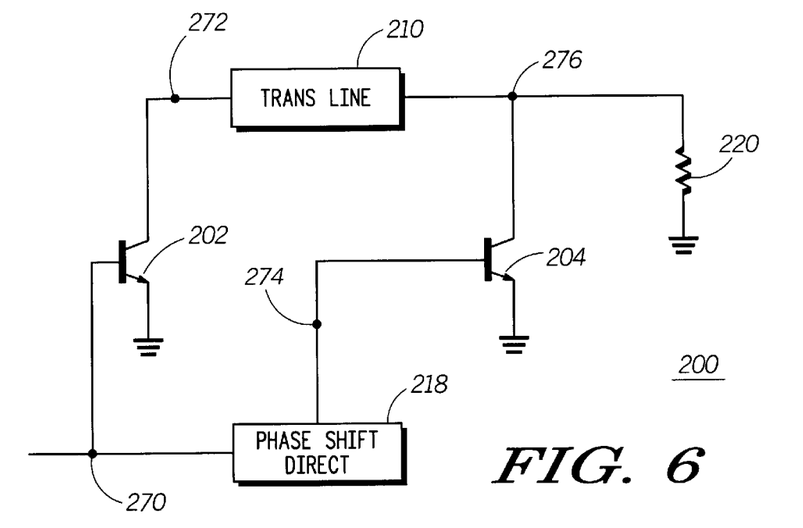
FIG. 6 is an exemplary two stage distributed amplifier consistent with certain embodiments of the present invention.
Figure 7:
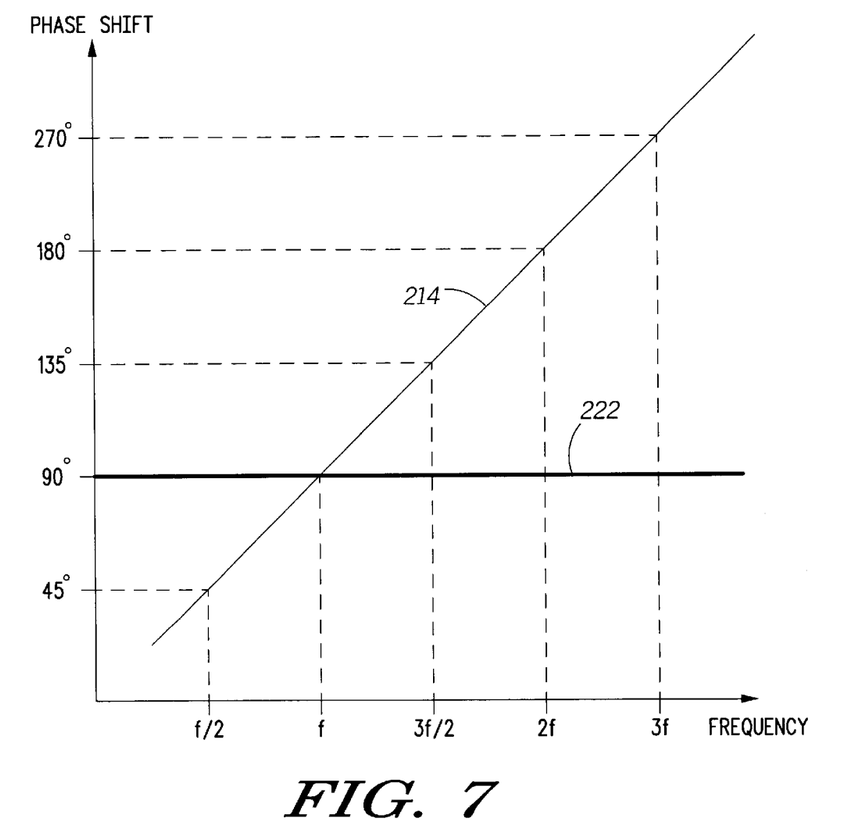
FIG. 7 is a graph of phase shift versus frequency for a transmission line used in the output circuit of a distributed amplifier consistent with certain embodiments of the present invention.
Figure 8:
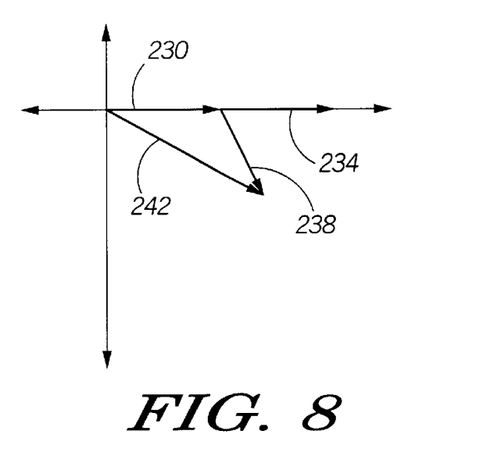
FIGS. 8, 9, 10, and 11 are a set of graphs showing output vectors of the amplifier of FIG. 6 consistent with certain embodiments of the present invention.

To illustrate, by way of a simple example, certain embodiments of the present invention, consider an amplifier circuit 200 such as that shown in FIG. 6. In this circuit example, two amplifier stages (in this case bipolar) 202 and 204 have a conventional output transmission line 210 that provides linear phase shift between nodes 272 and 276 at frequencies of interest ranging from frequency f/2 up to frequency 2f as shown in FIG. 7 by curve 214. Assume also that the input phase shift circuit 218 has a phase shift characteristic between nodes 270 and 274 shown by curve 222 of FIG. 7. Thus, at frequency f, the phase shifts of 210 and 218 are equal in magnitude and equal in phase, (90 degrees) so that at frequency f, the output signals from amplifiers 202 and 204 align in phase and are thus directly additive in magnitude at node 276. This is illustrated in FIG. 8, where vector 230 represents the output of amplifier 202 at node 276 and vector 234 represents the output of amplifier 204 at node 276. The combined additive output delivered to load 220 is thus double in magnitude with no phase difference. At the frequency f, the illustrative two stage amplifier 200 delivers the maximum power to the load 220.

At frequency f/2, the two networks 210 and 218 have 45 degrees of phase shift difference, so the output magnitude is as illustrated in the second vector diagram of FIG. 8 wherein the output of amplifier 202 at node 276 is again represented by vector 230. The output at frequency f/2 of amplifier 204 at node 276 is represented by vector 238. Thus, the combined output delivered to the load 220 at node 276 is approximately 1.85 in magnitude with a phase shift of about −22.5 degrees. Therefore, in this simple example, the amplifier produces a small amount of attenuation in output (approximately 0.6 db relative to the maximum at f) at frequency f/2.

Figure 9:
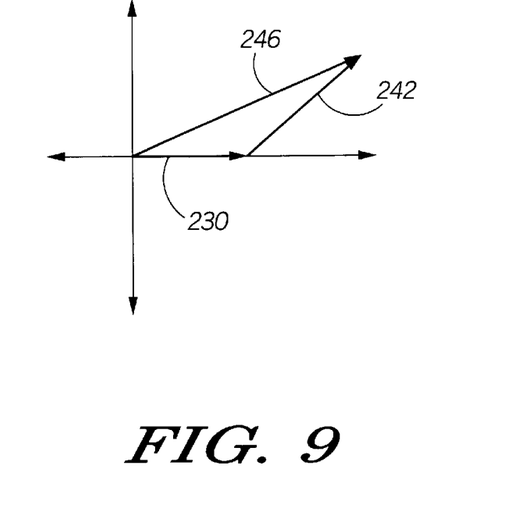

FIG. 9 illustrates the operation at frequency 3f/2 wherein the phase difference between the outputs of the two amplifiers 202 and 204 at node 276 is again 45 degrees. The output of amplifier 202 at node 276 is again represented by vector 230. The output of amplifier 204 at node 276 at frequency 3f/2 is represented by vector 242. Thus, the combined output delivered to the load 220 at node 276 is approximately 1.85 in magnitude with a phase shift of about 22.5 degrees as shown by vector 246. This again illustrates that at frequency 3f/2, a small amount of attenuation relative to maximum (again, approximately 0.6 db) is achieved by the current exemplary circuit.

Figure 10:
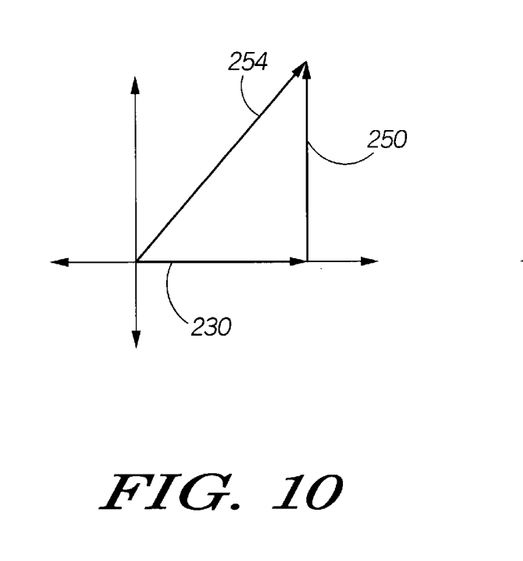

FIG. 10 illustrates the operation at frequency 2f wherein the phase difference between the outputs of the two amplifiers 202 and 204 at node 276 is 90 degrees. The output of amplifier 202 at node 276 is again represented by vector 230. The output of amplifier 204 at node 276 at frequency 2f is represented by vector 250. Thus, the combined output delivered to the load 220 at node 276 is approximately 1.41 in magnitude with a phase shift of about 45 degrees as shown by vector 254. This results in an attenuation relative to maximum amplification (at f) of approximately 3.0 db at frequency 2f.

Figure 12:
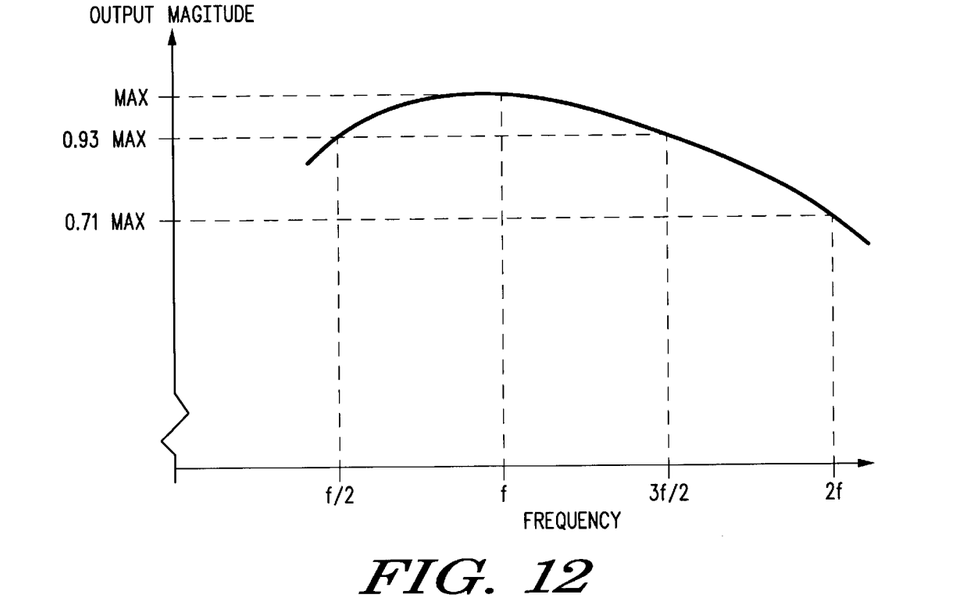
FIG. 12 is a graph of the frequency response of the amplifier of FIG. 6.

The overall frequency response of the simple two stage amplifier 200 of FIG. 6 between f/2 and 2f is depicted in FIG. 12. While the bandpass filtering effect of this simple example is modest, those skilled in the art will appreciate that the example is intended to illustrate how the parameters of an amplifier designed using the concepts consistent with embodiments of the present invention can be manipulated to create frequency selectivity in a distributed amplifier circuit. In this simple example, the amplification characteristics of the first amplifier stage 202 are essentially those of a conventional distributed amplifier and produces a flat amplification characteristic across all frequencies of interest. However, by use of the second stage with the difference in phase shift between the output phase shift circuit and the input phase shift circuit, a degree of selectivity is achieved. Use of this same simple circuit arrangement with multiple stages will further increase the frequency selectivity of the amplifier as a whole. Moreover, use of these principles with different phase shift characteristics than those of the simple example above can be used to dramatically alter the frequency response of the overall amplifier.

Figure 11:
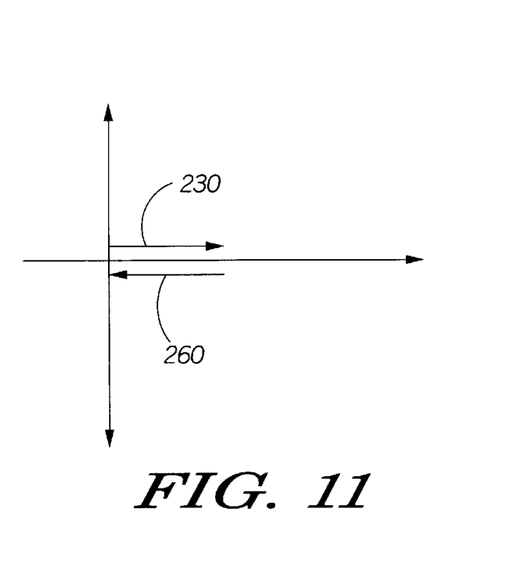

From the above, it can be seen that with the relatively simple modifications to the phase shift circuits of a distributed amplifier, the frequency response can be shaped into a low pass, high pass or band pass frequency response. Consider further the effect that can be obtained for a stage of amplification in a distributed amplifier if the difference in phase between the input phase shift circuit and the output phase shift circuit at node 276 is made to be 180 degrees. This is illustrated in FIG. 11 where the output of amplifier 202 at node 276 is again represented by vector 230 while the output of amplifier 202 at node 276 is represented by vector 260. In this example, the output of amplifier 202 is completely cancelled by the out of phase output of amplifier 204 to create a transmitter null output at the frequency 3f wherein the phase shift difference is 180 degrees. This principle can be used to create significant nulls in frequency response at any desired frequency. As long as the amplifier devices as well as the path losses are identical (equal amplitudes) the combined signals will cancel completely as illustrated. In addition to having complete cancellation of the signal at a given frequency f, the same cancellation will be seen at Nf where N is an odd integer greater than one. Those skilled in the art will appreciate that this characteristic can be advantageously utilized to eleminate spurrious harmonic contributions of oscillators and mixers in radio transmitter applications.

If the two signals summed, in this exemplary two stage embodiment, have a different phase transfer function versus frequency to the summing node, this can be used to provide selective frequency response as shown. An exemplary application of this technology, for example, is that receiver noise can be reduced on a transmitter signal to simplify receiver and transmitter filter design requirements. Another application of this technology is to create a second harmonic low impedance termination at the summing node to improve power efficiency (since power is not utilized amplifiying an undesired harmonic).

Figure 13:
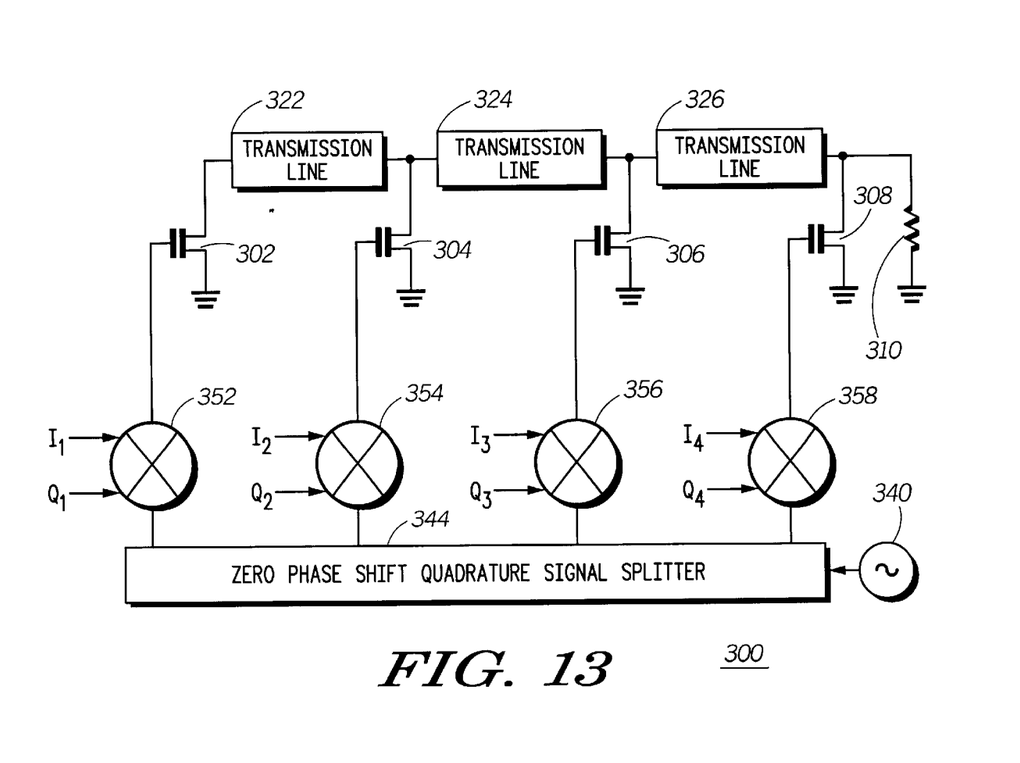
FIG. 13 is an exemplary four stage distributed amplifier consistent with certain embodiments of the present invention.

Referring now to FIG. 13, an implementation of a four stage differential amplifier consistent with an embodiment of the present invention is illustrated as amplifier 300. In this embodiment, four amplifier stages 302, 304, 306 and 308 using FET devices is illustrated driving a load 310. In this example, three transmission lines 322, 324 and 326 are used as output phase shift networks with each having frequency response characteristics, for example, similar to the response shown in FIG. 7 curve 214.

In this example, as might be applied to a wireless data transmission system, quadrature modulation techniques are used to generate the input phase shift circuit. A local oscillator 340 generates a carrier signal at frequency $f_0$ which is applied to a zero phase shift quadrature signal splitter 344 which splits the local oscillator signal into four equal local oscillator signals which are applied to four mixers 352, 354, 356 and 358. These mixers mix I and Q (inphase and quadrature) signals in a known manner with the local oscillator signal to produce the input to each of the four amplifier stages 302, 304, 306 and 308. In this manner, the I and Q signals are to be amplified are provided to each of the four amplifier stages with a zero phase shift across the band of interest. Any noise or spurious components produced by or received at the local oscillator 340, signal splitter 344 and mixers 352, 354, 356 and 358 are similarly applied to the amplifiers 302, 304, 306 and 308 so that such signals are subject to the frequency selective properties of the amplifier 300.

In this embodiment, the combination of the mixers and the signal splitter produces a frequency dependent transfer function that is electronically programmable with the use of independent isolated quadrature modulator signal sources. The phase shift introduced by the quadrature modulator is constant across frequencies of the RF signal. This is also true for frequency or amplitude modulated carrier signals applied to the quadrature modulator. Essentially the input network phase shift is frequency independent while the passive output network still has a frequency dependent phase shift function.

There are many alternative passive network designs to select from for the distributed output network. Some examples include transmission line, constant k low pass section, m-derived sections, bridge T networks, and lumped transmission line sections. Each design will have a unique frequency dependent phase shift transfer function that can be used to provide noise signal rejection. The exemplary quadrature modulator not only provides a means of alignment at the desired operation frequency, but also provides compensation for imbalance across manufacturing and environmental conditions such as temperature and supply voltage where electrical parameters can vary.

Figure 14:
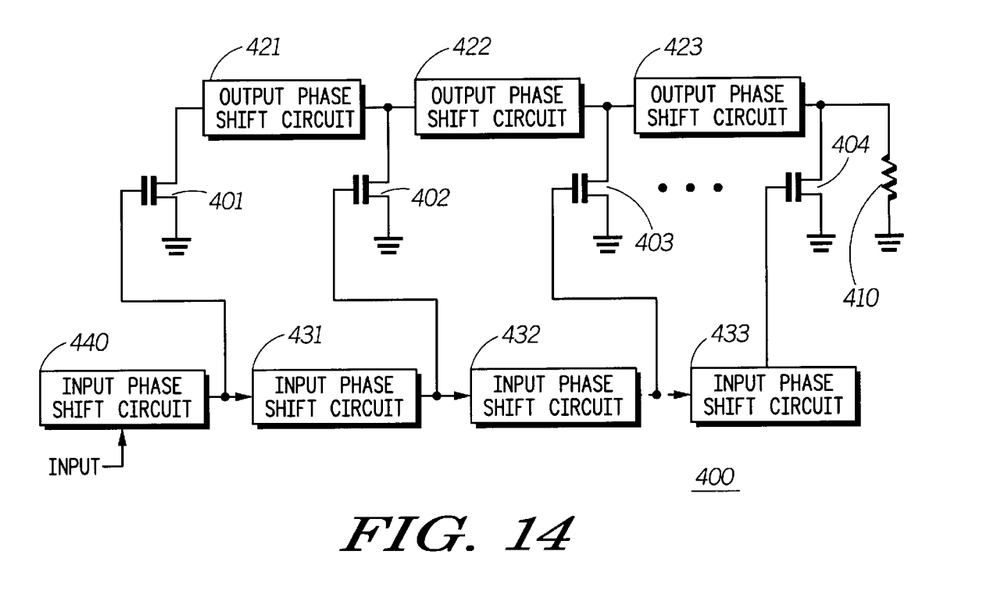
FIG. 14 is a generalized representation of a distributed amplifier consistent with certain embodiments of the present invention.

Turning now to FIG. 14, a somewhat generalized representation of a distributed amplifier consistent with certain embodiments of the present invention is shown as amplifier 400. This amplifier 400 (shown with FET amplifier stages, but this should not be considered limiting) has a plurality of N amplifier stages 401, 402, 403 through 404 that collectively drive load 410. The plurality of N amplifier stages 401, 402, 403, . . . , 404 have input nodes and output nodes. A plurality of N–1 output phase shift circuits 421, 422, through 423 connect the output nodes of the plurality of amplifier stages in a manner that causes output signals from the plurality of output nodes to add together for delivery to the load 410, the plurality of output phase shift circuits 421, 422 through 423 have a plurality of phase shifts of $\theta(f) = \{\theta(f)_{1,2}; \theta(f)_{2,3}; \ldots; \theta(f)_{N-2,N-1}\}$, where $\theta(f_0)_{a,b}$ represents a phase shift between output nodes of amplifiers a and b at frequency $F_0$. A plurality of N–1 input phase shift circuits 431, 432 through 433 are coupled to the plurality of input nodes and provide input signals thereto. The plurality of input phase shift circuits 431, 432, . . . , 433 have a plurality of phase shifts of $\Phi(f) = \{\Phi(f)_{1,2}; \Phi(f)_{2,3}; \ldots; \Phi(f)_{N-2,N-1}\}$, where $\Phi(f_0)_{a,b}$ represents a phase shift between input nodes of amplifier stages a and b at frequency $F_0$. To achieve the frequency selectivity of the current invention, $\theta(f)$ is not equal to $\Phi(f)$, so that output signals from the plurality of N amplifier stages 401, 402, 403, . . . , 404 are added with a frequency dependent phase relationship. For generality, the input may be applied to the first stage 401 through a phase shift network 440 without departing from the present invention.

Certain embodiments of this invention use a delay network in an RF signal processing transmitter application for reduction of the noise signal at the receiver frequency band from the desired transmitter signal. In addition the delay network can be placed in a low level signal point along the RF transmitter gain path allowing tuned linear operation using conventional means. By distributing the active device across several smaller devices and connecting input and outputs with equal delay networks the parasitic frequency limiting shunt capacitance is overcome. This is done by absorbing the shunt capacitance into an artificial transmission line with significantly increased frequency response over a single larger active device. By modifing the input delay network to maintain an equal delay as the output network at the desired operating frequency, but with modified delay function outside the desired frequency band, unique frequency response functions can be achieved.

Figure 15:
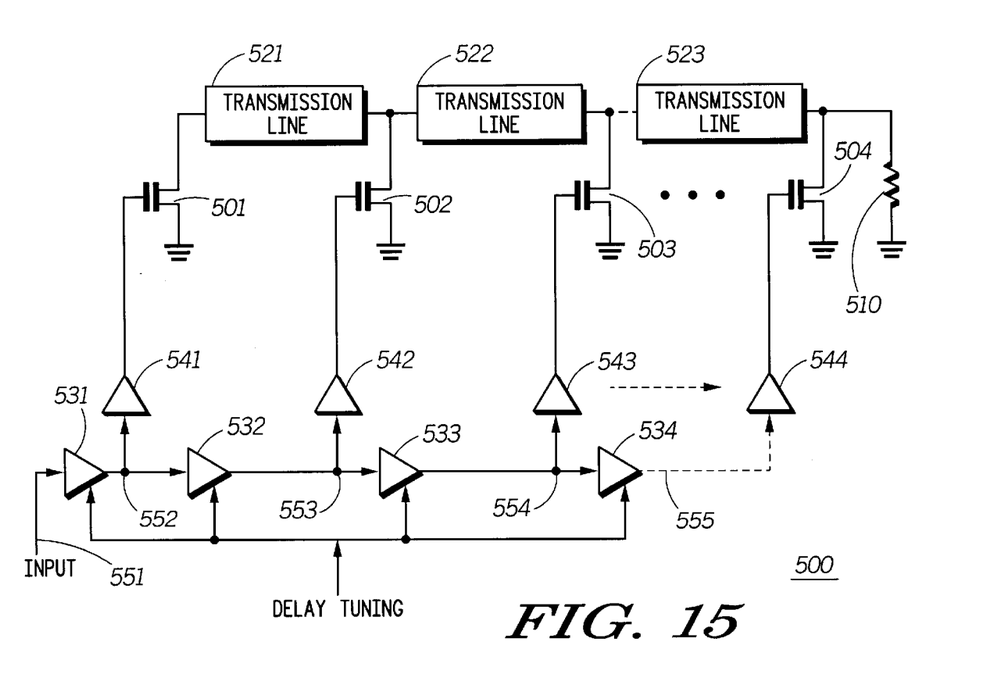
FIG. 15 is generalized representation of a distributed amplifier consistent with certain embodiments of the present invention using digital buffers as input delay elements.

Referring now to FIG. 15, a distributed amplifier configuration consistent with the present invention is shown using an alternative electronic delay line input network using binary inverter stages configured as digital buffers. The amplifier stages 501, 502, 503, . . . , 504 in this embodiment use transmission lines as output circuits 521, 522, . . . , 523. Buffers 531, 532, 533, . . . ,534 provide phase shifting to the input signals. Drive signals to the amplifier stages can be provided through buffers 541, 542, 543, . . . , 544 if needed with appropriate accounting for the delay introduced by these buffers. Buffers 531, 532, 533, . . . , 534 may be implemented to have an adjustable time delay between the transition signal applied at the input and the occurrence of the transition at the output terminals 552, 553, 554 and 555. The time delayed signal at the amplifier's inputs is correlated with the output network time delay to provide in-phase combination of the output signals at the desired operating frequency. Binary two state signals are applied to the distributed amplifier input terminals instead of sine waves. For class C, D, E, F, and S enhanced power added efficiency operation binary two state switching signals are applied.

This buffer input network provides a type of delay line network to realize a phase difference at the undesired frequencies to provide out of phase summations of the output signals from the amplifier stages at undesirable frequencies. What results is the desired phase alignment at the operating frequency across a very broad range. However, at any operating condition where the input network delay has been adjusted for the desired operating frequency to have in phase combining at the output nodes, noise other than the operating frequency will be subject to non-coherent cancellation at these output nodes. The amount of cancellation or rejection is a function of the combining correlation. A correlation value of 1 will have no rejection while a correlation of −1 will have complete rejection or cancellation at the output node. Other delay line implementations can also be used for the input or output phase shift circuit in other embodiments without departing from the invention.

Figure 16:
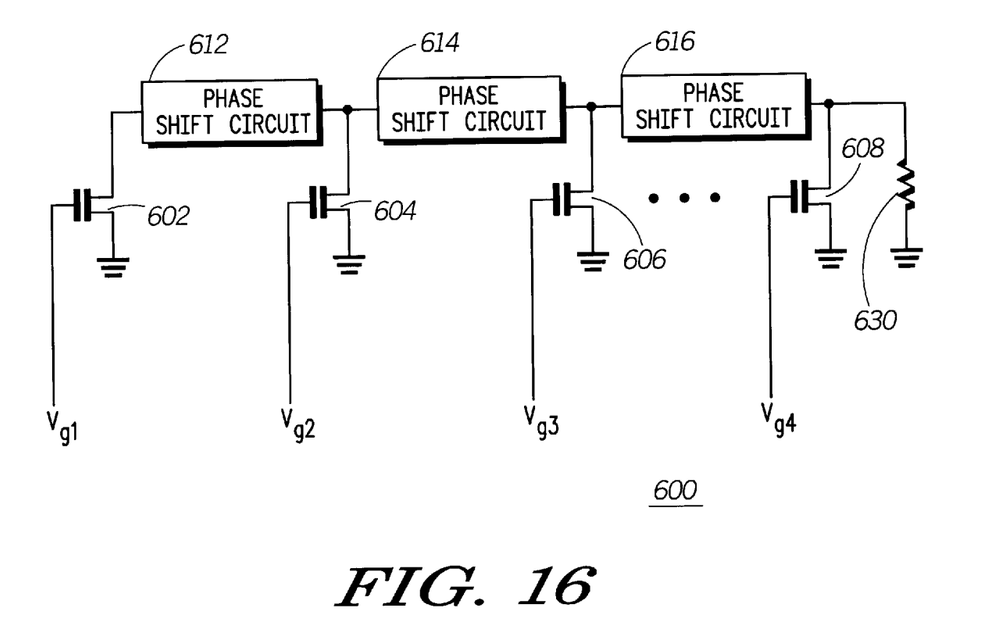
FIG. 16 is a four stage distributed amplifier with independent input signals consistent with certain embodiments of the present invention illustrating the amplifier's effect on uncorrelated noise.

Referring now to FIG. 16, the effect of uncorrelated noise can be examined in a distributed amplifier 600 consistent with certain embodiments of the present invention. Consider four input signals $V_{g1}$, $V_{g2}$, $V_{g3}$ and $V_{g4}$ applied to the gates of four FET transistors (for example) 602, 604, 606 and 608 which, in conjunction with phase shift circuits 612, 614 and 616 (each having a phase shift of $e^{j\omega t + \theta}$) form a distributed amplifier driving load 630. Consider drive voltages having the form:

$$V_{g1} = A(t)e^{j(\omega t + \theta)} + n_1(t) \quad \text{Equation 1}$$

$$V_{g1} = A(t)e^{j(\omega t + 2\theta)} + n_2(t) \quad \text{Equation 2}$$

$$V_{g1} = A(t)e^{j(\omega t + 3\theta)} + n_3(t) \quad \text{Equation 3}$$

$$V_{g1} = A(t)e^{j(\omega t + 4\theta)} + n_4(t) \quad \text{Equation 4}$$

where $n_1(t)$, $n_2(t)$, $n_3(t)$ and $n_4(t)$ are noise signals.

In the event these noise signals are correlated, the output signal-to-noise ratio is equal to the input signal-to-noise ratio. However, if these input noise signals are uncorrelated, then the output signal-to-noise ratio is improved by a factor of $\log_2(N)$ where N is the number of stages of the distributed amplifier (four in this example). Thus, for a distributed amplifier where the multiple input signals are implemented with independent signal sources including the noise, the signal-to-noise ratio can be improved. If the distributed amplifier inphase signal combining design requirement has been implemented, the desired signal will be correlated at the output network summing nodes. However, the independent noise signals will not be correlated at these output nodes. The result will be that the summed output of uncorrelated noise is amplified with lower gain than the summed output of the correlated operating signal. Therefore, for a digital input stage modulator having noise shaping with uncorrelated noise properties at each input, the output signal-to-noise ratio of the amplifier is higher (improved) than the input signal-to-noise ratio.

Those skilled in the art will understand that the distributed amplifiers depicted herein are depicted as using field effect transistors and bipolar transistors. However, distributed amplifiers are commonly implemented using other types of transistors including, but not limited to, vacuum tubes, gallium arsenide devices, MOSFETS, MESFETS, etc. Moreover, the present illustrative examples are shown as single ended amplifiers, but the concepts described herein are equally and equivalently applicable to differential amplifier configurations. Such variations are equivalent and within the scope of the present invention. Additionally, as previously noted, the transmission lines can be lumped element approximations (for example, lumped element pi networks) or actual transmission lines or combinations thereof, and may or may not be tapered distributed transmission lines, and may or may not be quarter wavelength without departing from the present invention.

Although the present invention, as described in embodiments herein, is shown in exemplary embodiments using transmission lines as the output phase shift circuit and frequency independent phase shifts at the input phase shift circuits, this should not be considered limiting since any combination of circuits that produce differing phase shifts at the input and output can be equally well utilized to implement certain embodiments of the present invention.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A distributed amplifier, comprising:

a first amplifier stage having a first input node and a first output node;

a second amplifier stage having a second input node and a second output node;

an output phase shift circuit connecting the first and second output nodes, the output phase shift circuit having a first phase shift at a frequency $F_0$ and a second phase shift at a frequency $F_1$; and an input phase shift circuit, coupled to the first and second input nodes and providing input signals to the first and second input nodes, the input phase shift network having a phase shift at $F_0$ equal to the first phase shift, and having a phase shift at $F_1$ that is not equal to the second phase shift;

whereby, output signals from the first and second amplifier stages are added in phase at $F_0$ and are added with a phase difference at $F_1$ so that the distributed amplifier has greater gain at $F_0$ than at $F_1$.

2. The apparatus according to claim 1, wherein the output phase shift circuit comprises one of a lumped element transmission line and a distributed transmission line.

3. The apparatus according to claim 1, wherein the input phase shift circuit comprises:
   a zero phase shift quadrature signal splitter receiving an input signal and splitting the input signal into two equally phased signals;
   a pair of mixers, each receiving one of the two equally phased signals and mixing the equally phased signals with an in phase signal and a quadrature signal;
   the pair of mixers producing a pair of output signals that drive the first and second amplifier stage input nodes respectively.

4. The apparatus according to claim 1, wherein the input phase shift circuit comprises a delay element that introduces a fixed delay in input signals applied to the first and second input nodes, so that the input signal applied to the second input node is delayed relative to the input signal applied to the first input node by a fixed amount.

5. The apparatus according to claim 4, wherein the delay element comprises a logic buffer circuit.

6. The apparatus according to claim 5, wherein the logic buffer circuit has an adjustable delay from input transition to output transition.

7. The apparatus according to claim 1, wherein the input phase shift circuit comprises a passive phase shift network.

8. The apparatus according to claim 1, wherein the input phase shift circuit comprises an adjustable phase shift circuit.

9. The apparatus according to claim 1, wherein the output phase shift circuit comprises a passive phase shift network.

10. The apparatus according to claim 1, wherein the output phase shift circuit comprises an adjustable phase shift circuit.

11. The apparatus according to claim 1, further comprising a digital input stage modulator having noise shaping with uncorrelated noise properties that provides an input signal at each of the first and second input nodes, and wherein the distributed amplifier has an output signal-to-noise ratio that is higher than an input signal-to-noise ratio.

12. A distributed amplifier, comprising:
   a plurality of amplifier stages having input nodes and output nodes;
   an output phase shift circuit connecting the output nodes of the plurality of amplifier stages in a manner that causes output signals from the plurality of output nodes to add together for delivery to a load, the output phase shift circuit having a first phase shift at a frequency $F_0$ and a second phase shift at a frequency $F_1$; and
   an input phase shift circuit, coupled to the plurality of input nodes and providing input signals thereto, the input phase shift circuit having a phase shift at $F_0$ equal to the first phase shift, and having a phase shift at $F_1$ that is not equal to the second phase shift;
   whereby, output signals from the plurality of amplifier stages are added in phase at $F_0$ and are added with a phase difference at $F_1$ so that the distributed amplifier has greater gain at $F_0$ than at $F_1$.

13. The apparatus according to claim 12, wherein the output phase shift circuit comprises one of a lumped element and distributed transmission line.

14. The apparatus according to claim 12, wherein the input phase shift circuit comprises:
   a zero phase shift quadrature signal splitter receiving an input signal and splitting the input signal into a plurality of equally phased signals;
   a plurality of mixers, each receiving one of the plurality of equally phased signals and mixing the equally phased signals with an in phase signal and a quadrature signal; and
   the plurality of mixers producing a plurality of output signals that drive the plurality of amplifier stage input nodes respectively.

15. The apparatus according to claim 14, wherein the input phase shift circuit comprises a delay line that introduces a fixed delay in input signals applied to the plurality of input nodes, so that the input signal applied to each input node is delayed relative to the input signal applied to another input node by a fixed amount.

16. The apparatus according to claim 15, wherein the delay line comprises a series of tapped logic buffer circuits.

17. The apparatus according to claim 16, wherein each of the logic buffer circuits has an adjustable delay from input transition to output transition.

18. The apparatus according to claim 12, wherein the input phase shift circuit comprises a passive phase shift network.

19. The apparatus according to claim 12, wherein the output phase shift circuit comprises a passive phase shift network.

20. The apparatus according to claim 12, wherein the input phase shift circuit comprises an adjustable phase shift circuit.

21. The apparatus according to claim 12, wherein the input phase shift circuit comprises an adjustable phase shift circuit.

22. The apparatus according to claim 12, further comprising a digital input stage modulator having noise shaping with uncorrelated noise properties that provides an input signal at at each of the input nodes, and wherein the distributed amplifier has an output signal-to-noise ratio that is higher than an input signal-to-noise ratio.

23. An N stage distributed amplifier, comprising:
   a plurality of N amplifier stages having input nodes and output nodes;
   a plurality of N−1 output phase shift circuits connecting the output nodes of the plurality of amplifier stages in a manner that causes output signals from the plurality of output nodes to add together for delivery to a load, the plurality of output phase shift circuits having a plurality of phase shifts of $\theta(f)=\{\theta(f)_{1,2}; \theta(f)_{2,3}; \ldots; \theta(f)_{N-2,N-1}\}$, where $\theta(f_0)_{a,b}$ represents a phase shift between output nodes of amplifiers a and b at frequency $F_0$;
   a plurality of N−1 input phase shift circuits, coupled to the plurality of input nodes and providing input signals thereto, the plurality of input phase shift circuits having a plurality of phase shifts of $\Phi(f)=\{\Phi(f)_{1,2}; \Phi(f)_{2,3}; \ldots; \Phi(f)_{N-2,N-1}\}$, where $\Phi(f_0)_{a,b}$ represents a phase shift between input nodes of amplifier stages a and b at frequency $F_0$; and
   wherein, $\theta(f)$ is not equal to $\Phi(f)$, so that output signals from the plurality of N amplifier stages are added with a frequency dependent phase relationship.

24. The apparatus according to claim 23, wherein the output phase shift circuit comprises one of a lumped element and distributed transmission line.

25. The apparatus according to claim 23, wherein the input phase shift circuit comprises:
   a zero phase shift quadrature signal splitter receiving an input signal and splitting the input signal into a plurality of N equally phased signals;

a plurality of N mixers, each receiving one of the plurality of N equally phased signals and mixing the N equally phased signals with an in phase signal and a quadrature signal; and the plurality of N mixers producing a plurality of N output signals that drive the plurality of N amplifier stage input nodes respectively.

26. The apparatus according to claim 23, wherein the input phase shift circuit comprises an N−1 stage tapped delay line that introduces a fixed delay at each tap, so that an input signal applied to a $K^{th}$ input node is delayed relative to the input signal applied to the $(K-1)^{st}$ another input node by a fixed amount.

27. The apparatus according to claim 26, wherein the N−1 stage tapped delay line comprises a series of logic buffer circuits.

28. The apparatus according to claim 27, wherein each of the logic buffer circuits has an adjustable delay from input transition to output transition.

29. The apparatus according to claim 23, wherein the N−1 input phase shift circuits comprise N−1 passive phase shift networks.

30. The apparatus according to claim 23, wherein the N−1 output phase shift circuits comprise N−1 passive phase shift networks.

31. The apparatus according to claim 23, further comprising a digital input stage modulator having noise shaping with uncorrelated noise properties that provides an input signal at at each of the input nodes, and wherein the distributed amplifier has an output signal-to-noise ratio that is higher than an input signal-to-noise ratio.

* * * * *